US010330287B2

United States Patent
Baumeister et al.

(10) Patent No.: US 10,330,287 B2
(45) Date of Patent: Jun. 25, 2019

(54) LIGHT FOR ROOM AND BUILDING ILLUMINATION

(71) Applicant: BJB GmbH & Co. KG, Arnsberg (DE)

(72) Inventors: Olaf Baumeister, Sundern (DE); Markus Pieper, Arnsberg (DE)

(73) Assignee: BJB GmbH & Co. KG, Arnsberg (DE)

( * ) Notice: Subject to any disclaimer, the term of this patent is extended or adjusted under 35 U.S.C. 154(b) by 0 days.

(21) Appl. No.: 15/982,617

(22) Filed: May 17, 2018

(65) Prior Publication Data

US 2018/0372306 A1 Dec. 27, 2018

(30) Foreign Application Priority Data

Jun. 27, 2017 (DE) .................. 10 2017 114 235

(51) Int. Cl.
| | |
|---|---|
| H01L 33/60 | (2010.01) |
| F21V 15/01 | (2006.01) |
| F21V 3/02 | (2006.01) |
| H05K 1/05 | (2006.01) |
| F21V 5/04 | (2006.01) |
| F21V 29/503 | (2015.01) |
| F21V 29/507 | (2015.01) |
| F21S 4/28 | (2016.01) |
| H05K 1/02 | (2006.01) |
| H05K 1/18 | (2006.01) |
| F21Y 103/10 | (2016.01) |

(Continued)

(52) U.S. Cl.
CPC .............. *F21V 15/01* (2013.01); *F21S 4/28* (2016.01); *F21V 3/02* (2013.01); *F21V 5/043* (2013.01); *F21V 29/503* (2015.01); *F21V 29/507* (2015.01); *H05K 1/0209* (2013.01); *H05K 1/05* (2013.01); *H05K 1/18* (2013.01); *F21V 17/04* (2013.01); *F21Y 2103/10* (2016.08); *F21Y 2115/10* (2016.08); *H05K 2201/10106* (2013.01)

(58) Field of Classification Search
CPC ... H05K 2201/10106; H05K 2201/189; H05K 2201/028
See application file for complete search history.

(56) References Cited

U.S. PATENT DOCUMENTS

2010/0008085 A1* 1/2010 Ivey .................... F21K 9/27
    362/218
2013/0088863 A1  4/2013 Park et al.
(Continued)

FOREIGN PATENT DOCUMENTS

DE  202009011688 U1  1/2010
DE  102013017141 A1  3/2014
(Continued)

*Primary Examiner* — Andrew J Coughlin
(74) *Attorney, Agent, or Firm* — Von Rohrscheidt Patents

(57) ABSTRACT

A light for room and building illumination, the light comprising an illuminant, including a circuit board including a carrier material, an insulation layer applied to the carrier material at least on one side, conductive paths applied to the insulation layer, and at least one LED that is arranged on the insulation layer and functions as the illuminant, at least one light permeable cover arranged subsequent to the LED in a light exit direction, a light housing in which the circuit board is arranged, characterized in that the circuit board is a metal core circuit board which forms the light housing.

9 Claims, 5 Drawing Sheets

(51) Int. Cl.
  *F21Y 115/10*  (2016.01)
  *F21V 17/04*  (2006.01)

(56) References Cited

U.S. PATENT DOCUMENTS

| | | | |
|---|---|---|---|
| 2013/0343054 A1* | 12/2013 | Yang | F21V 23/00 |
| | | | 362/249.01 |
| 2014/0334164 A1 | 11/2014 | Miyata | |
| 2015/0338879 A1* | 11/2015 | Hiramoto | G06F 1/163 |
| | | | 361/679.03 |
| 2016/0088721 A1* | 3/2016 | Sepkhanov | H05K 1/0277 |
| | | | 362/296.01 |

FOREIGN PATENT DOCUMENTS

| | | |
|---|---|---|
| DE | 202012104635 U1 | 4/2014 |
| DE | 202013103294 U1 | 12/2014 |
| DE | 102014000741 B4 | 6/2016 |
| EP | 3094161 | 11/2016 |
| KR | 1020080095222 A | 10/2008 |
| KR | 1020100050446 A | 5/2010 |

* cited by examiner

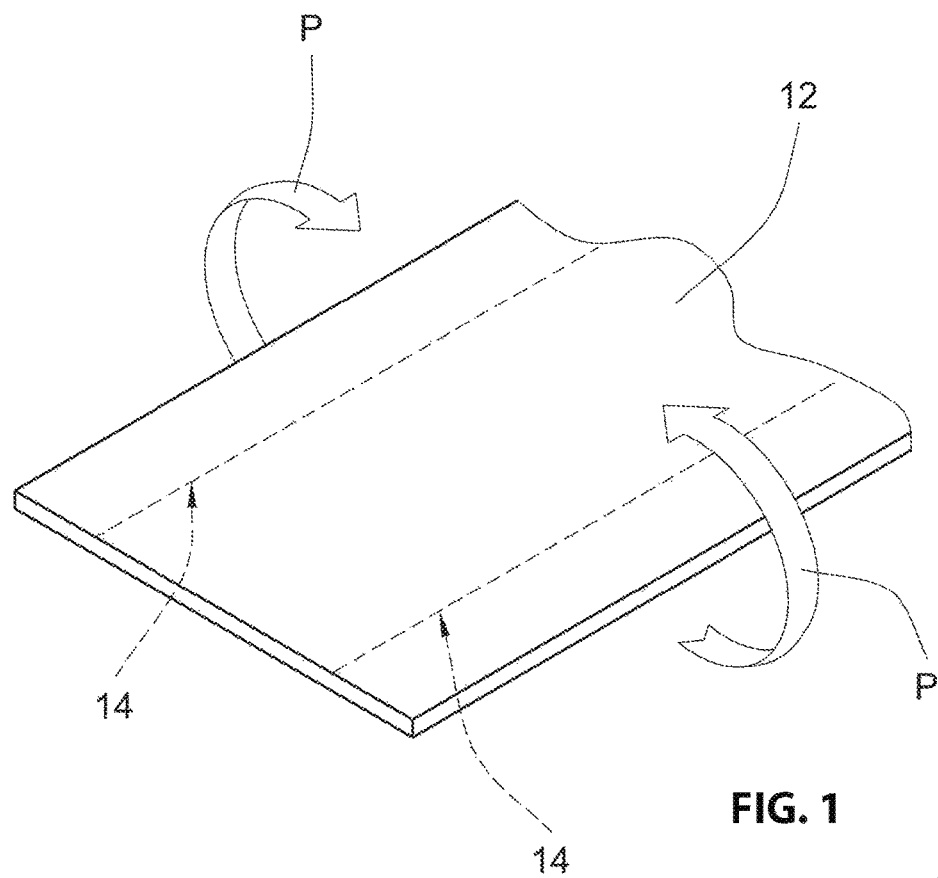
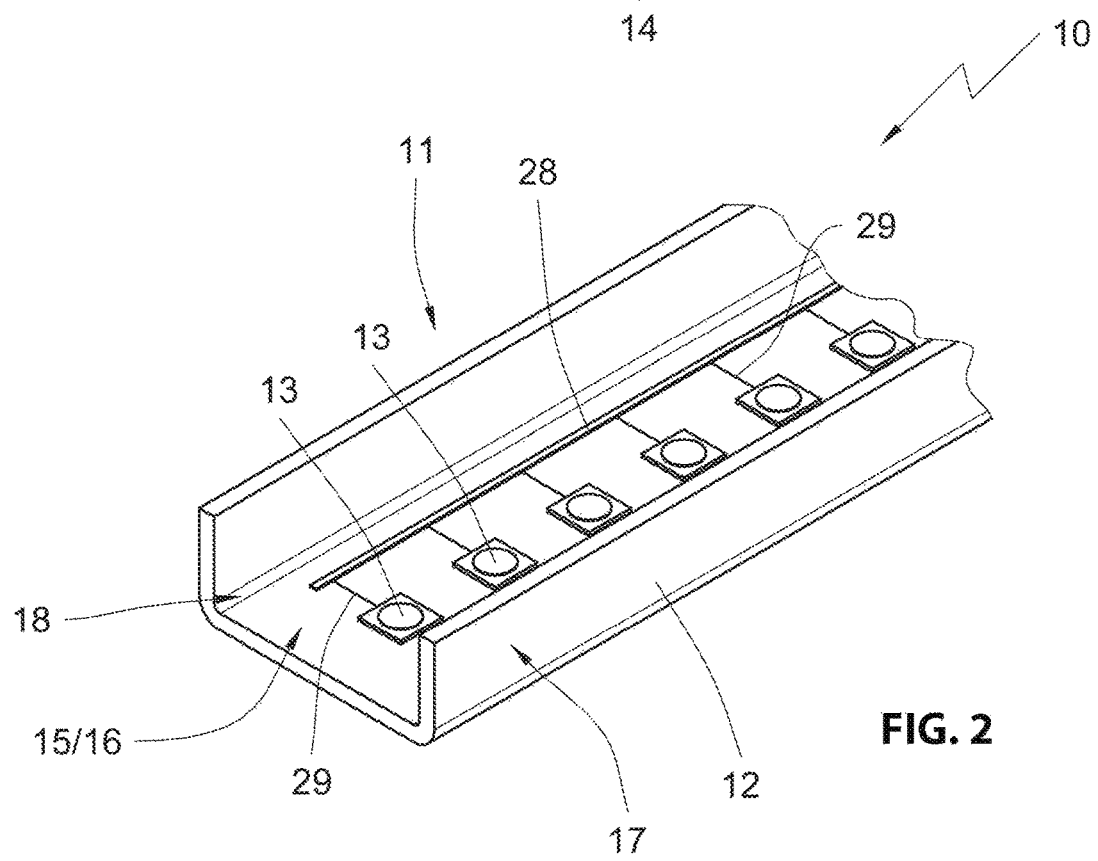

LIGHT FOR ROOM AND BUILDING ILLUMINATION

RELATED APPLICATIONS

This application claims priority from and incorporates by reference German patent application DE 10 2017 114 235.5 filed on Jun. 27, 2017.

FIELD OF THE INVENTION

The invention relates to a light for room and building illumination, the light comprising an illuminant, including a circuit board including a carrier material, an insulation layer applied to the carrier material at least on one side, conductive paths applied to the insulation layer, and at least one LED that is arranged on the insulation layer and functions as the illuminant,
at least one light permeable cover arranged subsequent to the LED in a light exit direction,
a light housing in which the circuit board is arranged.

BACKGROUND OF THE INVENTION

Lights of the generic type recited supra are known in the art. There are for example lights that use fluorescent tubes or classic gas discharge or incandescent bulbs which are retrofitable with LED illuminants.

Modern lights are designed to use LEDs as illuminants. Thus, the LEDs on their circuit boards are typically integrated into the light. Typically the LED applied to the circuit board is mounted on a cooling element which is anchored in a position in the light housing that corresponds to the desired radiation characteristics.

DE 10 2014 000 741 B4 discloses the type of light recited supra.

This conventional method of designing lights provides a high degree of freedom for a light designer or a light manufacturer to design the light housing as well as options to arrange illuminants within the light for predetermined light radiation characteristics. This high degree of freedom, however, comes with considerable assembly and production complexity which causes increased fabrication cost.

BRIEF SUMMARY OF THE INVENTION

Thus, it is an object of the invention to provide a light that is simple in configuration and is producible in an economical manner.

The object is achieved by a light for room and building illumination, the light including an illuminant, including a circuit board including a carrier material, an insulation layer applied to the carrier material at least on one side, conductive paths applied to the insulation layer, and at least one LED that is arranged on the insulation layer and functions as the illuminant, at least one light permeable cover arranged subsequent to the LED in a light exit direction, a light housing in which the circuit board is arranged, wherein the circuit board is a metal core circuit board which forms the light housing.

The object is also achieves by a method for producing a light which includes a light housing which includes a circuit board with a LED configured as an illuminant, wherein the circuit board is a metal core circuit board, the method including the step forming the metal circuit board along at least two forming lines into a light housing so that the metal core circuit board forms the light housing, and arranging the LED between the forming lines.

The invention proposes to perform a maximum component reduction and to have the light housing formed by the metal core circuit board on which the LEDs are arranged that are required for illumination. When the circuit board provided with the LEDs is designated as the actual illuminant the invention is characterized in that the light is formed exclusively by the illuminant. Thus, however, degrees of freedom with respect to housing design and arrangement of LEDs to provide particular light characteristics are limited, however, there are numerous applications where these degrees of freedom are not necessary, for example when the light is used in particular for industrial or technical purposes.

For lights in warehouses for example the illumination of particular surfaces or objects is paramount, the design of the light itself is secondary.

In greenhouses the lights are used primarily to optimize plant growth. Illuminating the greenhouses so they are agreeable to a human user or optimized for his activity, however, is secondary and can be provided if needed by a special work illumination that is optimized for this purpose. The core idea of the invention is to reduce lamp production to give a corresponding housing shape to the metal circuit board which can be provided for example by a forming process in an advantageous embodiment. If the application of the lamp does not require any particular measures only a grid connection element has to be applied to the lamp housing after the forming process in order to secure power supply.

Arranging the LED circuit boards in a lamp housing possibly at different angles to achieve particular illumination characteristics, internal wiring, heat management by cooling elements or other heat conductive elements can be omitted when using the invention.

In an ideal situation it is provided that the metal core circuit board forms the lamp housing using at least one forming process, wherein the metal core circuit board forms at least one channel-shaped cavity in which the LED is arranged.

It is furthermore provided that the channel-shaped cavity is defined by face side terminal elements which are configured for example as a lamp socket or lamp holder which provides grid connection as well as attachment with minimal additional complexity.

It is furthermore provided that the surface of the metal core circuit board is configured without an insulation layer in surface portions that are deflected out of an arrangement plane of the LED by forming, in particular when the housing sections of the metal circuit board are deflected out of the arrangement plane of the LED by forming are used for dissipating operating heat of the LED, wherein it is provided that the housing sections of the metal core circuit board that are used for dissipating the operating heat of the LED have a sufficient surface size for dissipating the heat.

If required for particular applications the metal circuit board can include support devices for a light permeable cover.

Thus, the object of the invention is also achieved by a method for producing a light which includes a light housing which supports a circuit board with an LED configured as an illuminant, characterized in that a metal core circuit board is used for the circuit board wherein the metal core circuit board is formed along at least two forming lines to provide the light housing, wherein the circuit board forms the light housing, wherein the LED is arranged between forming lines.

The method can be further improved in that a surface of the metal core circuit board is kept without an insulation layer and without a conductive path in surface portions that are oriented outside of the arrangement plane of the LED.

The method can provide that the surface of the metal core circuit board is provided with support devices for a cover.

BRIEF DESCRIPTION OF THE DRAWINGS

Additional advantages and a more detailed description of the invention are now provided based on embodiments with reference to drawing figures, wherein FIG. 1 illustrates a schematic partial view of a circuit board;

FIG. 2 illustrates a light housing made from the circuit board according to FIG. 1;

DETAILED DESCRIPTION OF THE INVENTION

Figure 3:
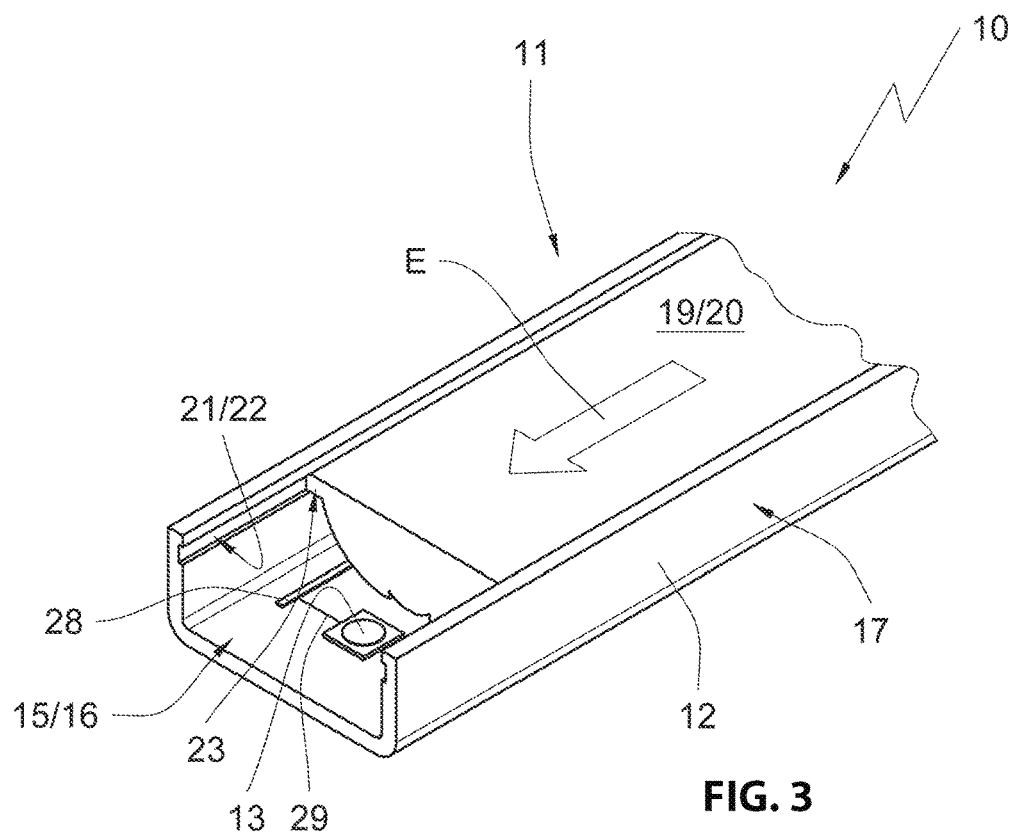
FIG. 3 illustrates an assembly of a cover in a light housing according to FIG. 2.

In the drawing figures the light according to the invention is overall designed reference numeral 10.

The light 10 includes a light housing 11 which is produced from a metal core circuit board 12 that is illustrated in FIG. 1. The illustration of the metal core circuit board 12 in FIG. 1 is highly simplified. Illustrating conductive paths and LEDs 13 that are arranged on the metal core circuit board 12 is omitted.

Advantageously the metal core circuit board is a flat element which is formed along two forming lines 14 to provide the light housing 11. In the embodiment the forming lines 14 are arranged parallel with one another and with a distance from each other. Forming according to the forming direction U illustrated by arrows 10 yields the light housing 11 of the light 10 that is illustrated in FIG. 2 in an exemplary manner and configured approximately channel-shaped.

The arrangement portion 15 formed for LEDs 13 and arranged between the forming lines 14 forms the channel-base 16. The sections that are erected by the forming provide the channel walls 17. Thus, the metal core circuit board 12 can be provided with weakened material zones 18 along the forming lines 14 before the forming process which simplifies the forming process. Schematically illustrated conductive paths 28 and 29 supply voltage to the LEDs.

Figure 4:
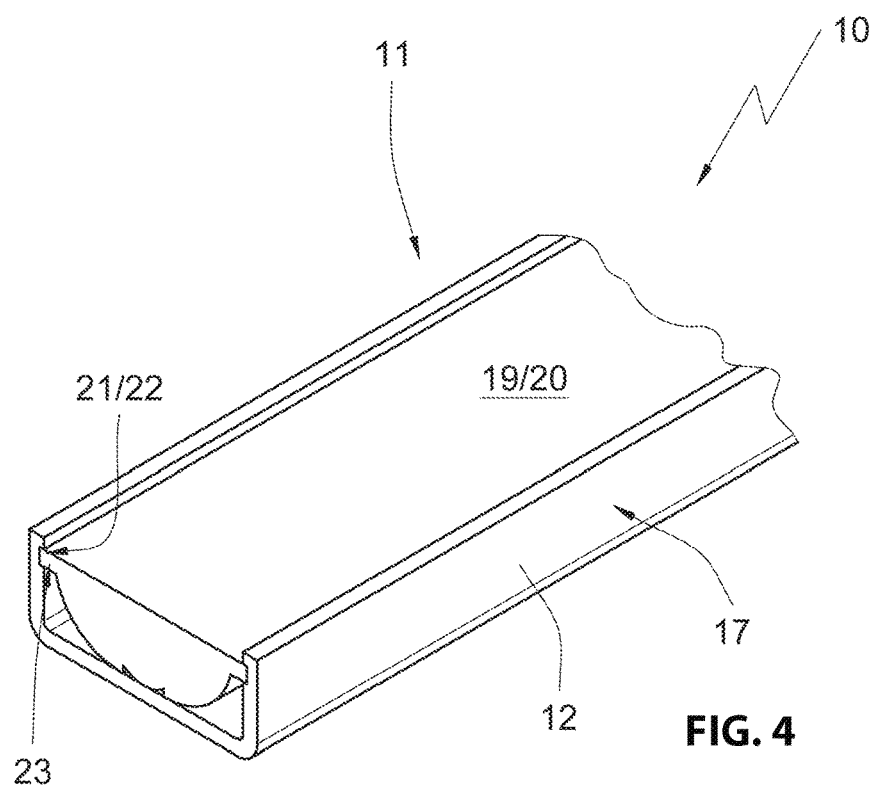
FIG. 4 illustrates the light housing according to FIG. 3 after mounting the light permeable cover.

If required in a particular application the light 10 can include a light permeable cover 19 which is configured as optics 20 in the embodiments in FIGS. 3 and 4 and which influences distribution of light emitted by the LEDs 13.

In order to arrange the optics 20 in the light housing 11 of the embodiment according to FIGS. 3 and 4 surfaces of the channel walls 17 that are oriented towards each other are respectively provided with a retaining element 21 which is a support groove 22 in the embodiment of FIGS. 3 and 4. Retaining arms 23 of the optics 20 engage the support groove 22 so that the optics 20 are insertable along a longitudinal axis 10 into the light housing 11 as indicated by the insert arrow E.

Figure 5:
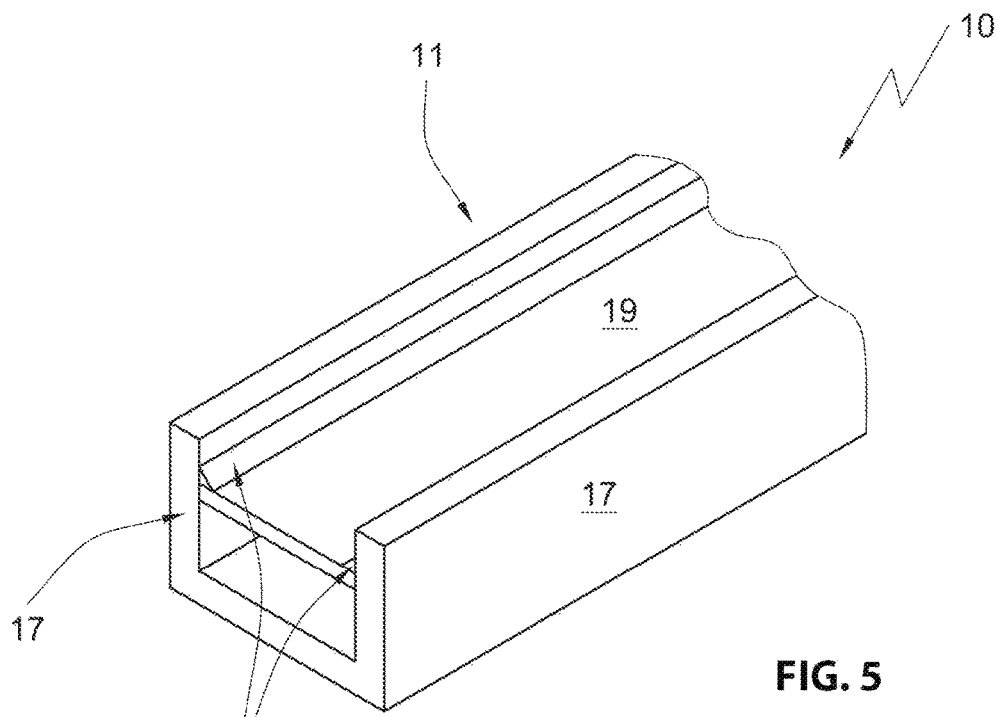
FIG. 5 illustrates an alternative embodiment of the housing according to FIG. 4.
Figure 6:
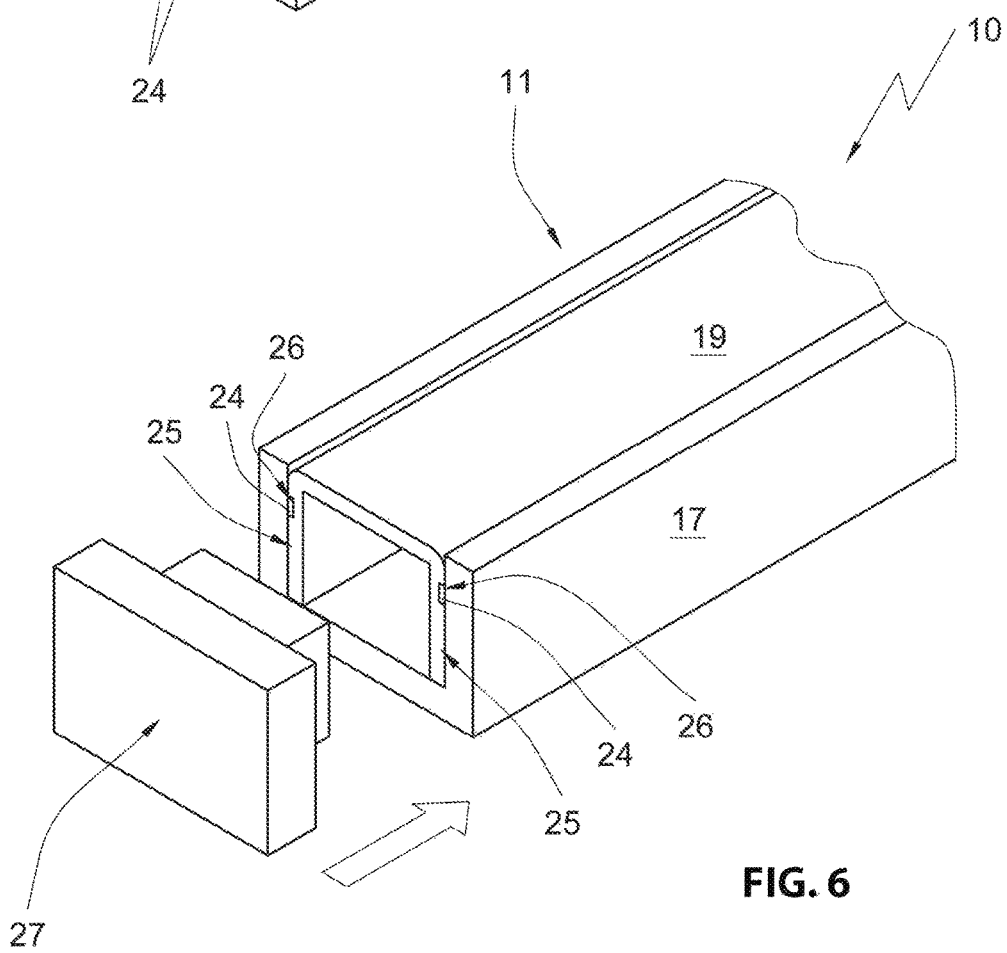
FIG. 6 illustrates an alternative embodiment of the housing according to FIG. 4.
Figure 7:
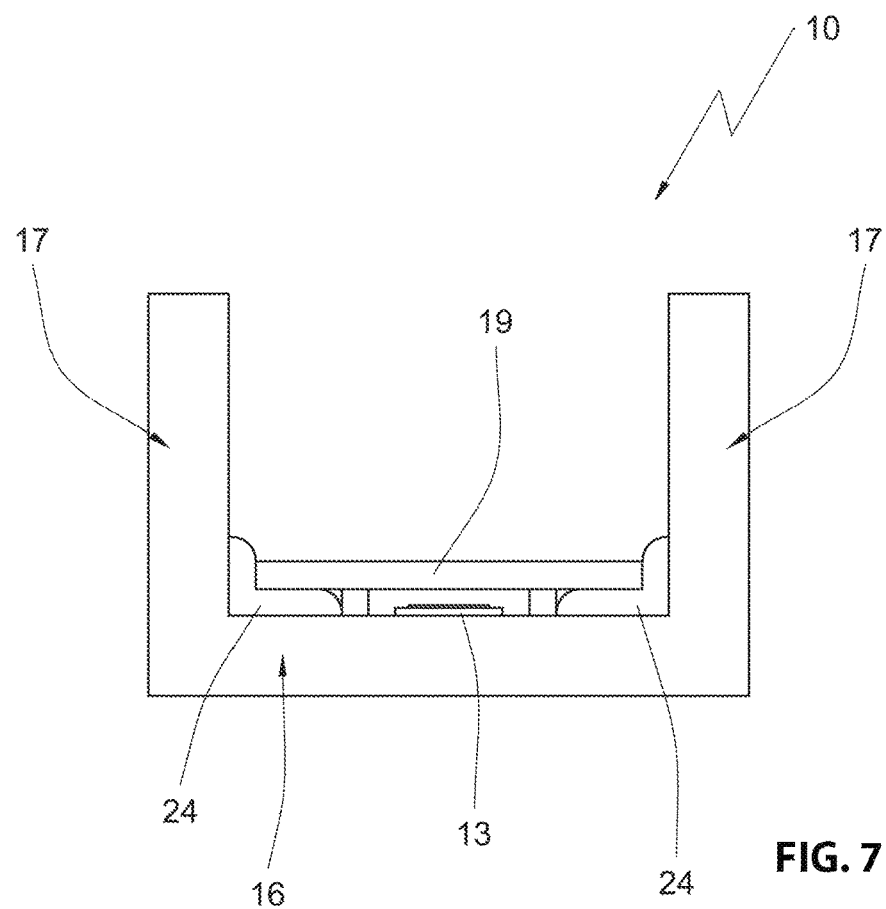
FIG. 7 illustrates an alternative embodiment of the housing according to FIG. 4.
Figure 8:
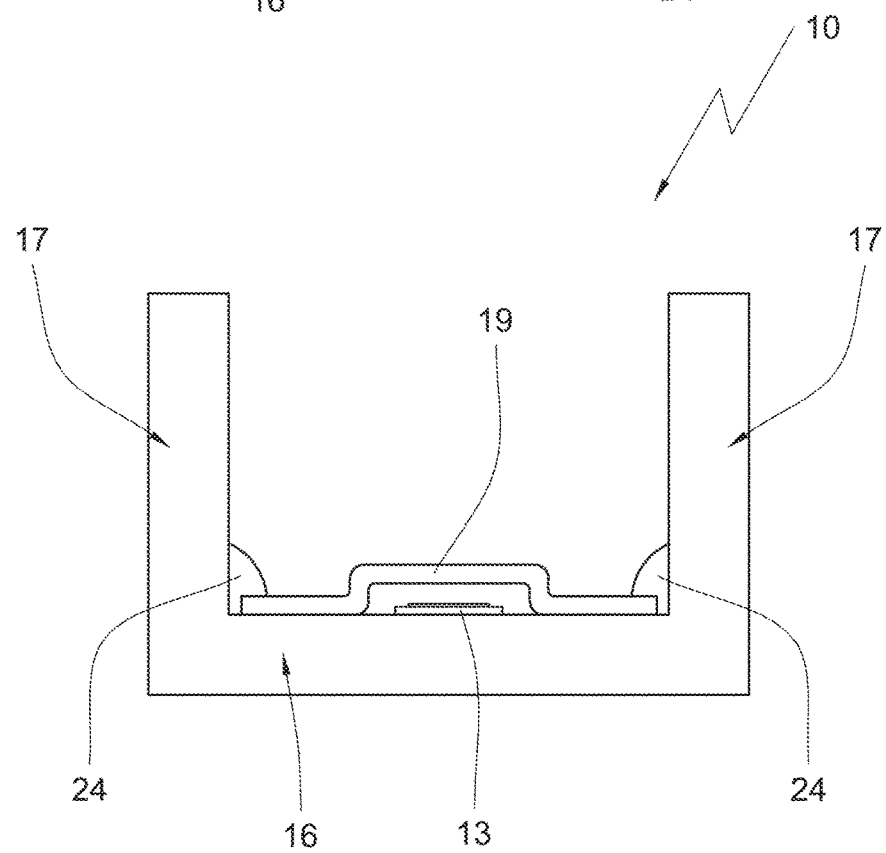
FIG. 8 illustrates an alternative embodiment of the housing according to FIG. 4.

Alternative embodiments of the light 10 are illustrated in FIGS. 5-8. FIG. 5 illustrates a light 10 whose light permeable cover 19 is provided with a seal material 24 in its arrangement portions at the channel walls 17 of the light housing 11, wherein the seal material 24 can also be used for mechanical fixation of the cover element 19. This seal material 24 in FIG. 5 can be for example a glue with a sealing function. Alternative variants are illustrated in FIGS. 7 and 8. Also here the seal material 24 can be a glue. Otherwise it is conceivable that the light permeable cover 19 is respectively pressed into the seal material 24 and thus supported through friction locking.

FIG. 6 illustrates an embodiment of the light 10 in which the light permeable cover 19 is also configured as a channel-shaped element. The channel-shaped element is respectively provided with a receiving groove at its channel walls 25 wherein the receiving groove is oriented in a direction 17 of the light 10. The seal material 24 is inserted into the channel wall.

FIG. 6 is furthermore used for a schematic illustration of an assembly of the light 10. Face caps 27 are applied to a face of the light housing 11 in order to close face openings of the channel-shaped recess of the light housing. This face cap 27 can thus be configured as a connecting component by which the light 10 is provided with electricity. Furthermore the face caps 27 can be used for supporting the housing 10 at suitable counter pieces.

Figure 9:
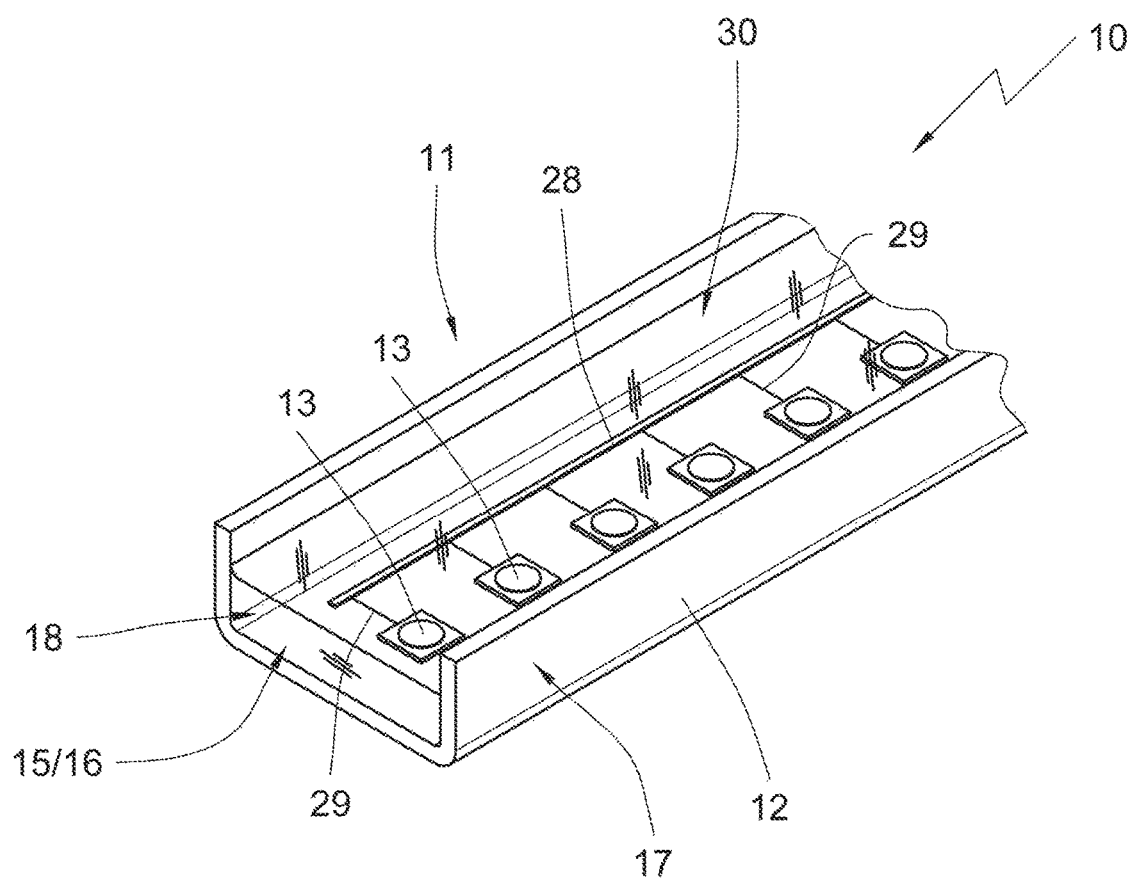
FIG. 9 illustrates an alternative embodiment of the housing according to FIG. 4 with an encasement compound forming a light permeable cover.

FIG. 9 illustrates an embodiment where the light permeable cover 19 (not illustrated) is formed by a transparent encasement compound. The encasement compound is cast into the channel shaped light housing 11 and cures thereafter. This way the LEDs are hermetically sealed towards the ambient so that a maximum amount of protection against humidity and contamination is achieved.

To sum it all up, the invention discloses a light 10 which is producible in a particularly simple manner and which is suitable in particular for technical applications. Since the light 10 is essentially formed by the metal core circuit board 12 of the illuminant itself a number of fabrication and assembly steps that are required for prior designs can be omitted so that the light 10 can be produced in a particularly efficient and economical manner.

REFERENCE NUMERALS AND DESIGNATIONS

10 Light
11 Light housing
12 Metal core circuit board
13 LED
14 Forming line
15 Arrangement portion
16 Channel base
17 Channel wall
18 Weakened material zone
19 Light permeable cover
20 Optics
21 Retaining element
22 Regaining groove
23 Retaining arm
24 Seal material
25 Channel wall 26 Receiving groove
27 Face cap
28 Conductive path
29 Conductive path
P Arrow
U Forming direction
E Insert arrow

What is claimed is:

1. A light for room and building illumination, the light comprising:
   an illuminant, including:
   a circuit board including a carrier material, an insulation layer applied to the carrier material at least on one side, conductive paths applied to the insulation layer, and at least one LED that is arranged on the insulation layer and functions as the illuminant,
   at least one light permeable cover arranged subsequent to the LED in a light exit direction,
   a light housing in which the circuit board is arranged,
   wherein the circuit board is a metal core circuit board which forms the light housing,
   wherein the light housing is formed along at least two forming lines of the metal core circuit board, and wherein an insulation layer with the conductive paths and with the LED is arranged between the at least two forming lines of the metal core circuit board,
   wherein a surface of the metal core circuit board is provided without an insulation layer in surface portions that are deflected from an arrangement plane of the LED,
   wherein the surface portions are deflected from the arrangement plane of the LED substantially by a right angle and oriented substantially in the light exit direction, and
   wherein an entire surface portion between the at least two forming lines is provided with the insulation layer.

2. The light according to claim 1, wherein the metal core circuit board forms the light housing through at least one forming process of the metal core circuit board.

3. The light according to claim 2, wherein housing sections of the metal core circuit board that are deflected from the arrangement plane of the LED provide dissipation of LED operating heat.

4. The light according to claim 3, wherein the housing sections of the metal core circuit board that provide dissipation of the LED operating heat have a surface size that is sufficient to dissipate the LED operating heat.

5. The light according to claim 1, wherein the metal core circuit board includes a channel shaped cavity in which the LED is arranged.

6. The light according to claim 5, wherein the channel shaped cavity is defined by face side terminal elements which are configured as a lamp socket or as a lamp holder.

7. The light according to claim 1, wherein the metal core circuit board forms retaining devices for the at least one light permeable cover.

8. A method for producing a light which includes a light housing which includes a circuit board with a LED configured as an illuminant, wherein the circuit board is a metal core circuit board, the method comprising the step:
   forming the metal circuit board along at least two forming lines into a light housing so that the metal core circuit board forms the light housing, and arranging the LED between the forming lines,
   wherein the surface of the metal core circuit board does not include an insulation layer in the surface portions that are deflected from an arrangement plane of the LED by the forming, and
   wherein the surface portions are deflected from the arrangement plane of the LED substantially by a right angle and oriented substantially in the light exit direction, and
   wherein an entire surface portion between the at least two forming lines is provided with the insulation layer.

9. The method according to claim 8, wherein the surface of the metal core circuit board is provided with retaining devices for a cover.

* * * * *